US007736995B2

(12) United States Patent
Vos

(10) Patent No.: US 7,736,995 B2
(45) Date of Patent: Jun. 15, 2010

(54) PROCESS FOR PRODUCING COMPONENTS

(75) Inventor: Markus Vos, Ingelheim (DE)

(73) Assignee: Schott AG, Mainz (DE)

( * ) Notice: Subject to any disclaimer, the term of this patent is extended or adjusted under 35 U.S.C. 154(b) by 623 days.

(21) Appl. No.: 10/567,511

(22) PCT Filed: Aug. 16, 2004

(86) PCT No.: PCT/EP2004/009177

§ 371 (c)(1), (2), (4) Date: Mar. 27, 2007

(87) PCT Pub. No.: WO2005/018874

PCT Pub. Date: Mar. 3, 2005

(65) Prior Publication Data

US 2007/0170597 A1 Jul. 26, 2007

(30) Foreign Application Priority Data

Aug. 18, 2003 (DE) ................................ 103 37 920

(51) Int. Cl.
*H01L 21/30* (2006.01)
*H01L 21/78* (2006.01)

(52) U.S. Cl. ....................... 438/458; 438/455; 438/460; 438/464; 438/127; 257/E21.599

(58) Field of Classification Search ................. 438/460, 438/464, 455, 458, 127
See application file for complete search history.

(56) References Cited

U.S. PATENT DOCUMENTS

| | | | | |
|---|---|---|---|---|
| 3,417,642 | A | 12/1968 | Kempenaers | 83/13 |
| 3,694,972 | A | 10/1972 | Emeis | |
| 4,138,304 | A * | 2/1979 | Gantley | 156/268 |
| 4,828,052 | A * | 5/1989 | Duran et al. | 175/55 |
| 6,319,754 | B1 * | 11/2001 | Wang et al. | 438/113 |
| 2002/0096743 | A1 * | 7/2002 | Spooner et al. | 257/620 |
| 2003/0148057 | A1 * | 8/2003 | Dietz et al. | 428/43 |

FOREIGN PATENT DOCUMENTS

| | | |
|---|---|---|
| CH | 557091 | 12/1974 |
| CN | 1420849 | 5/2003 |
| EP | 0279949 | 8/1988 |
| JP | 6304899 | 3/1995 |

OTHER PUBLICATIONS

"Bearbeiten Keramischer Werkstoffe Mit Dem Ultraschallschwinglappen," Technische Rundschau, Hallwag Verlag. Bern, CH, Bd. 83, No. 37, Sep. 13, 1991, pp. 26, 28.

English Translation of: "Bearbeiten Keramischer Werkstoffe Mit Dem Ultraschallschwinglappen," Technische Rundschau, Hallwag Verlag. Bern, Ch, Bd. 83, No. 37, Sep. 13, 1991, pp. 26, 28.

"Optics, Mechanics and Electronics Information," vol. 13, No. 11, p. 9, col. 2, 1996.

* cited by examiner

*Primary Examiner*—Alexander G Ghyka
(74) *Attorney, Agent, or Firm*—Ohlandt, Greeley, Ruggiero & Perle, L.L.P.

(57) ABSTRACT

The invention relates to a process for producing components, in particular small glass plates such as windows for optical caps for optical components. The process includes providing a substrate, providing a carrier, joining a first surface of the substrate to a first surface of the carrier, machining the components out of the substrate, and detaching the components from the carrier in order to separate the components.

17 Claims, 4 Drawing Sheets

PROCESS FOR PRODUCING COMPONENTS

CROSS REFERENCE TO RELATED APPLICATIONS

This application claims the benefit under 35 U.S.C. §365 of International Application Serial No. PCT/EP2004/009177, filed Aug. 16, 2004 and German Application No. 103 37 920.7 filed Aug. 18, 2003, the entire contents of both which are incorporated by reference herein.

BACKGROUND OF THE INVENTION

1. Field of the Invention

The invention relates to a process for producing a plurality of separate components in general, and to a process for producing small glass plates, for example windows for optical components, in particular.

2. Description of Related Art

Glass is suitable for use as a contact material or covering material in many application areas. However, glass is difficult to machine, which is disadvantageous in particular if very small components, such as for example windows for optical caps, are to be produced.

Conventional glass-machining techniques, such as scoring and breaking, are difficult to use for such applications, on account of the component size. Furthermore, the above mentioned techniques require subsequent edge machining, which may under certain circumstances have to be carried out individually, which entails considerable costs.

In order nevertheless to keep the costs of these processes within acceptable limits, it is typical to work using a stacked assembly. In this case, a plurality of optical components are combined to form a stack and drilled. One drawback is that the edges still have to be machined in a separate working step. The joining of the layers is usually carried out using wax or other adhesive substances.

Although the stacking on the one hand reduces costs, the use of the joining materials causes contamination which has to be removed again by complex cleaning processes, which on the other hand forces the costs up again.

In practice, yet another difficulty has manifested itself, which not only makes the process expensive but also considerably impairs the quality of the products. This difficulty is that during the cleaning of the glasses so as to remove the adhesive substances, relative movements occur between the glasses, which often leads to scratches in the surface.

This is particularly disadvantageous if glasses with a high-quality and expensive coating are being processed.

One such example which may be mentioned is a complex antireflection coating having a multiplicity of extremely thin layers of various types. This is because under certain circumstances these coatings are particularly susceptible to scratches, on account of their mechanical properties.

With conventional processes, therefore, there is an interactive relationship between contradictory demands on cost efficiency and quality.

SUMMARY OF THE INVENTION

Therefore, the invention is based on the object of providing a process for producing components, which is inexpensive and at the same time achieves a high component quality.

In particular, it is an object of the invention to provide a process of this type that ensures a high surface quality of components, in particular made from sensitive materials, for example glass.

Another object of the invention is to provide a process of this type that is suitable in particular for very small components, e.g. small glass plates.

Yet another object of the invention is to provide a process of this type which allows the simultaneous and efficient production of a multiplicity of components.

The object of the invention is achieved in a surprisingly simple way by the subject matter of the present application.

In the method according to the invention for the simultaneous production of a plurality of separate components, e.g. of small glass plates, a laterally uniform or single-piece sheet-like substrate is provided. In this context, the term laterally single-piece means that the substrate, which extends in one lateral plane, in this stage of the process forms a structural unit in the substrate plane. The substrate is preferably in single-layer form transversely with respect to the plane, but it is also possible for it to be of multi-layer form. Furthermore, the substrate has a first surface and a second surface, which in particular extend along the lateral plane and lie parallel to one another on opposite sides.

Furthermore, the invention provides a sheet-like carrier which includes a first surface and a second surface, these surfaces preferably being parallel and on opposite sides. The first surface of the carrier is joined to the first surface of the substrate in sheet-like and releasable fashion, so that the substrate and the carrier form a layer composite in which the carrier and the substrate are in particular arranged parallel to one another.

After the joining step, a multiplicity of components are produced from the substrate by the components being machined out of the substrate, in particular by cutting or punching. In other words, the substrate is divided into a multiplicity of laterally adjacent portions, forming laterally separate components.

However, the components are held together at least immediately after the machining-out step, even though they are in particular completely laterally separate from one another, by virtue of the fact that the components are or remain secured to the carrier and the carrier is not divided, or at least is not completely divided. Consequently, the orientation and the position of the components are retained by virtue of the fact that they are secured to the carrier.

This allows efficient production of the components and simple handling, and it is possible to achieve an extremely high component quality, in particular surface quality.

Accordingly, the invention provides an intermediate product in the form of a layer composite, which comprises a multiplicity of laterally separate components and one common sheet-like carrier, the components being releasably secured to a common carrier laterally adjacent to one another.

Only subsequently, in a further working step, if appropriate with further working steps in between, are the components detached from the carrier in order for the components to be finally singulated or separated such that they are no longer held together.

This step can advantageously even be carried out under clean room conditions.

The process according to the invention is particularly suitable for the production of very small and thin glass plates, for example made from display glass and/or with a diameter of <5 mm. Small glass plates of this type are used, for example, for what are known as optical caps to encapsulate optical components. In the case of thin glass, the machining time is advantageously short.

A, preferably planar, substrate or a layer comprising or consisting of glass or a vitreous material is used. It is also possible for a glass layer to be deposited on the carrier by evaporation coating.

The carrier used is preferably a carrier film, in particular made from plastic, laminated onto the glass substrate, or vice versa. In this context, it should be ensured that the carrier provides sufficient stability, since it subsequently has to temporarily hold the glass plates together. Furthermore, the joining is releasable, in order for the plates subsequently to be singulated. In this context, a carrier film whose bonding force can be released by UV light has proven particularly suitable.

Films of this type advantageously do not leave behind any contamination on the component surface and prevent scratching of the optical functional surface during machining and handling of the intermediate product.

Therefore, it is preferable for the detaching of the components from the carrier to be carried out in two steps, in which case first of all the bonding force is released and then the components are picked off.

The machining-out of the components is preferably carried out by removing the substrate material in portions. This involves machining transversely with respect to the substrate plane, from the second surface of the substrate at least as far as the first surface of the substrate, and possibly even into the carrier film. Abrasive or grinding material-removal processes in which annular structures are machined out, are particularly suitable for producing and singulating the portions within the annular structure. In this context, it should be noted that the carrier film should not be completely ground through, so that it advantageously retains its function as a carrier holding the components together.

Therefore, it is preferable for the substrate to be completely severed first of all, and then for the carrier material to be partially removed, specifically until a position between the first and second surfaces of the carrier has been reached or at least as far as the first surface of the carrier. In this case, it is preferable for a multiplicity of laterally adjacent components to be machined out of the substrate or laterally separated from one another simultaneously in one working step.

It is particularly preferable for the components to be machined out in structured form by means of vibratory lapping, in particular ultrasonic vibratory lapping. In this case, the components are punched out of the substrate using a plurality of hollow lapping punches, in which case each component that is to be produced is assigned precisely one lapping punch. It is therefore preferable to use a lapping tool which has a multiplicity of laterally adjacent lapping punches which machine the composite element in the same working step. It is preferable for an array or matrix of a large number of, for example several hundred to a thousand, lapping punches to be secured to a Sonotrode.

Ultrasonic vibratory lapping can advantageously be used to produce components with dimensions of from a few micrometers to several centimeters. Furthermore, the machining quality at the edge is already so high that under certain circumstances it is possible to dispense with conventional machining, such as grinding, which brings with it a huge cost saving.

The ultrasonic vibratory lapping is in particular carried out without stacking or joining the glass substrates, so that the risk of damaging the components can advantageously be reduced.

The shape of the lapping punches is matched to the shape of the components to be produced. This allows the lapping process to be adapted to the particular requirement in an advantageous way. According to a preferred embodiment of the invention, lapping punches which each have a cross section in the form of a continuous ring, e.g. a circular ring, i.e. in particular tubular lapping punches in the form of a downwardly open hollow body or hollow cylinder, are used in order for example to obtain circular glass plates.

Alternatively, it is also possible for the components to be machined out by blasting with a blasting agent, for example by means of sand-blasting, in which case the material of the substrate between the components to be produced is removed by the blasting. For this purpose, the substrate is covered in regions, for example with patterned photoresist or a solid mask, in particular a metal mask to protect from the blasting.

In particular by means of the blasting process, the second surface of the substrate, for example while the substrate and the carrier are still joined, can be structured before, after or at the same time as the machining-out of the components. By way of example, depressions, cavities, etc. are produced in the substrate.

The advantage of sand-blasting is that there is no need to use a shaping tool. Furthermore, the positional accuracy, for example using a photolithographic mask, is high. The dimensions of the components or structures are in this case subject to no restrictions from the tool geometry.

The detaching of the components from the carrier is carried out in particular after the machining-out step. By way of example, the components are picked off the carrier by means of vacuum.

The process according to the invention proves particularly advantageous if a solder agent, e.g. a solder paste, is to be applied, in order for example for the windows subsequently to be soldered onto a corresponding optical component.

The solder agent is in particular printed onto the second substrate surface as a structured solder-agent layer, for example by means of screen-printing technology. However, it is also possible to apply or print on other structured functional layers.

Preferably, in particular before the components have been machined out and/or if appropriate after the solder agent has been applied, a protective layer, e.g. a protective lacquer, which advantageously protects the surface from damage, is applied to the second surface of the substrate or to the solder-agent layer.

According to a preferred embodiment of the invention, the substrate or glass substrate is provided with a coating, e.g. an antireflective coating, for example on its first or second surface. Either the protective resist is applied to the coating, in order to protect the latter, or the coating is protected by the carrier film.

After the components have been machined out, the protective layer is divided into a multiplicity of separate portions, with each portion being assigned to one specific component.

It is also preferable for the components and portions of the protective layer, as a result of the machining-out step, to be machined or abraded so as to be flush transversely with respect to the substrate plane, in the same working step and using the same tool.

The solder-agent layer is divided into laterally adjacent and separate portions immediately before but in the same working step as the machining-out of the components. As a result, the solder-agent layer, after the components have been machined out and before the components are detached from the carrier, is divided into a multiplicity of laterally adjacent and separate portions, with each portion being assigned to precisely one specific component.

Also preferably, the protective layer is removed, for example by means of a continuous-passage or ultrasonic washing machine, in particular after the machining-out of the components and/or before the removal of the components from the carrier or before the separation. Therefore, the protective layer is removed in particular from the sheet-like substrate or substrate-carrier composite.

It is in this way advantageously possible to substantially avoid damage to the substrate surface, and the removal is significantly less complex compared to removal from the singulated component. The latter benefit manifests itself in an extremely advantageous way in particular in the case of components with small dimensions, e.g. with a diameter of <5 mm and the associated low weight.

In the text that follows, the invention is explained in more detail on the basis of exemplary embodiments and with reference to the drawings; the features of the various embodiments can be combined with one another, and identical and similar elements are provided with the same reference designations.

DETAILED DESCRIPTION OF THE INVENTION

Figure 1:
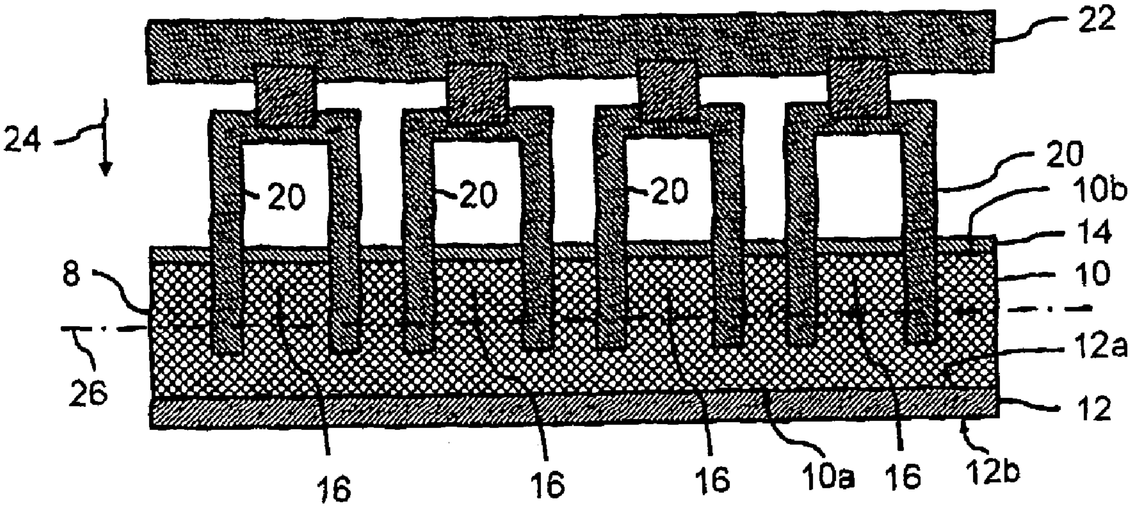
FIG. 1 shows a diagrammatic cross section in accordance with an embodiment of the invention.

FIG. 1 shows a composite element 8 comprising a glass substrate 10 with a laminated-on plastic film 12, the lower surface 10*a* of the glass substrate 10 and the upper surface 12*a* of the plastic film 12 being releasably surface-joined to one another. A protective resist 14 has been applied to an upper surface 10*b* of the substrate 10. The composite element 8 can be placed, for example, onto a work table by means of a lower surface 12*b* of the carrier film 12.

Four hollow-cylindrical lapping punches 20 arranged next to one another are excited to ultrasonic vibration by a Sonotrode via a common holder 22 and are subjected to the action of force in the direction indicated by the arrow 24. The lapping punches 20, on account of their shape, remove the material of the protective resist 14, of the substrate 10 and of the carrier film 12 in portions, or specifically in the shape of circular rings, in order to punch a multiplicity of components 16 out of the substrate 10. The substrate 10 is therefore machined over its entire surface in a single working step.

FIG. 1 illustrates the lapping punches 20 in a position in which they have penetrated all the way through the protective layer 14 and part way through the substrate 10 along the direction 24 in which force is applied, or transversely with respect to the substrate plane 26. The carrier film 12 has not yet been reached.

Figure 2:
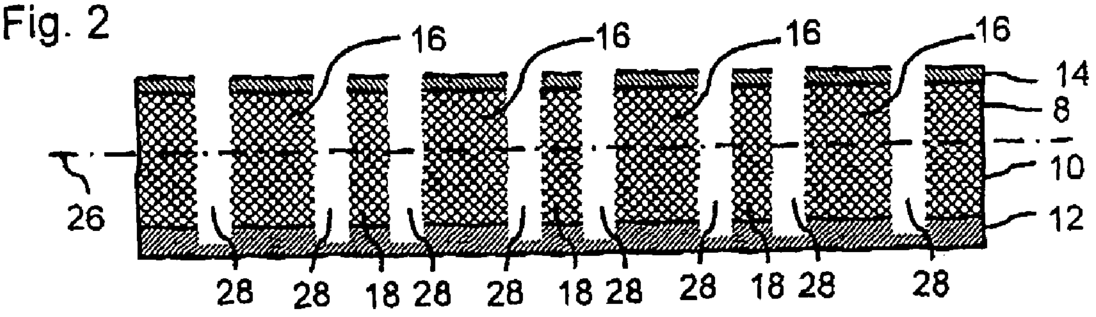
FIG. 2 shows a diagrammatic cross section of the embodiment from FIG. 1 in a subsequent stage of the process.

FIG. 2 shows the composite element 8, comprising the substrate 10, the carrier film 12 and the protective layer 14, after the components 16 have been machined out by means of the lapping punches 20 and the lapping punches 20 have been removed. A recess 28 in the form of a circular ring has in each case been produced around the cylindrical components or small glass plates 16 as a result of the abrasive machining-out using the lapping punches 20. It can be seen that the recess 28 penetrates all the way through the protective layer 14 and the substrate 10 transversely with respect to the substrate plane 26, whereas the lapping punches 20 have only penetrated part way into the carrier film. FIG. 2 shows the state of the composite element 8 after the machining-out step but before the components 16 have been detached from the carrier film 12.

Figure 3:
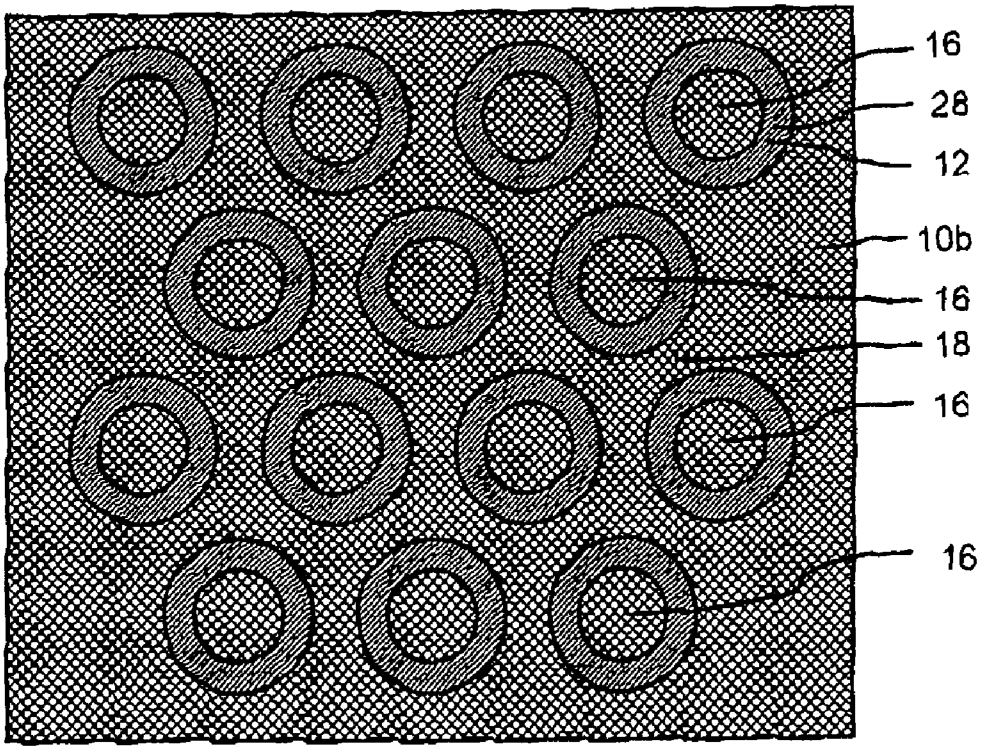
FIG. 3 shows a diagrammatic plan view onto the embodiment from FIG. 2 in a subsequent process stage.

FIG. 3 shows a plan view onto the composite element 8 from FIG. 2 after the protective layer 14 has been removed or washed off. Therefore, the upper surface 10*b* of the substrate 10 has been uncovered both at the components 16 and at the intermediate spaces 18 between the components 16. The carrier film 12 has been uncovered in the annular recesses 28, which have been machined out by the lapping punches.

Figure 4:
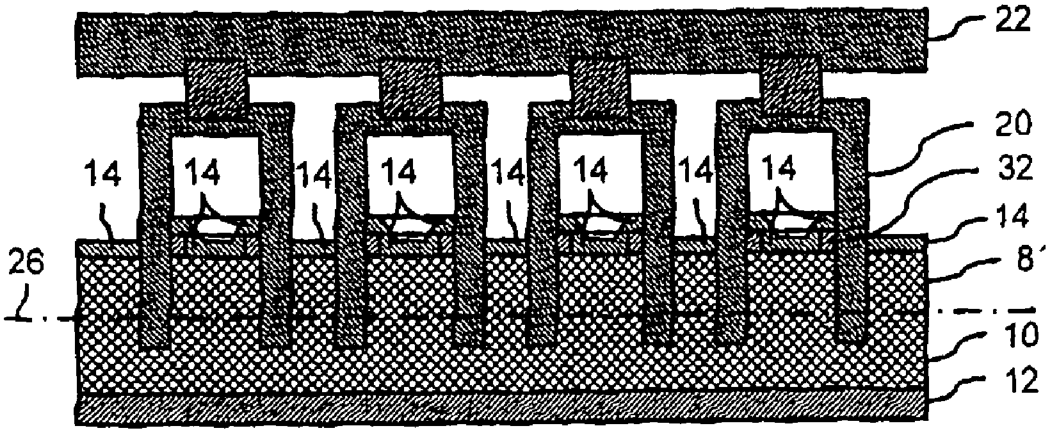
FIG. 4 shows a diagrammatic cross section in accordance with a further embodiment of the invention.

Referring now to FIG. 4, a composite element 8' with a similar structure to the composite element 8 is illustrated. The composite element 8' differs from the composite element 8 only by virtue of the fact that a solder-agent layer 32 in the form of a multiplicity of annular solderings has been printed on beneath the protective layer 14.

The solder-agent layer 32 has been printed on and dried in structured form as solder paste by means of screen printing prior to the application of the protective layer 14. To increase the bonding of the solder-agent layer to the substrate, it is additionally also possible to pre-vitrify the solder-agent layer.

Figure 5:
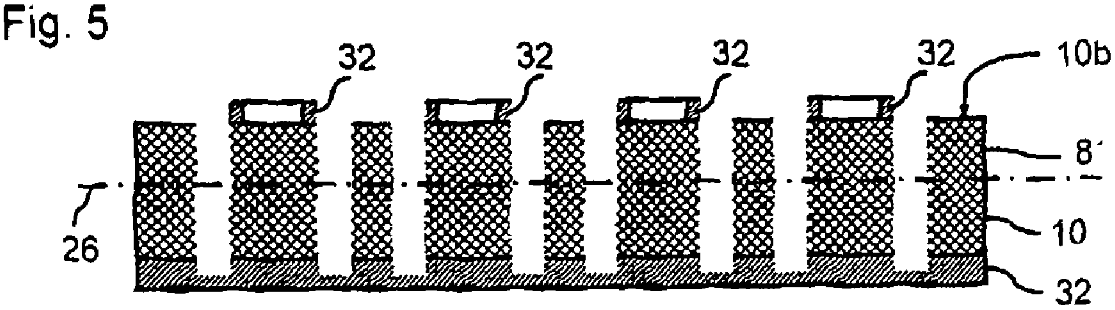
FIG. 5 shows a diagrammatic cross section of the embodiment from FIG. 4 in a subsequent stage of the process.

FIG. 5 shows a cross section through the composite element 8' following removal of the protective layer 14, with the composite element 8' still comprising the substrate 10, the carrier film 12 and the solder-agent layer 32.

Figure 6:
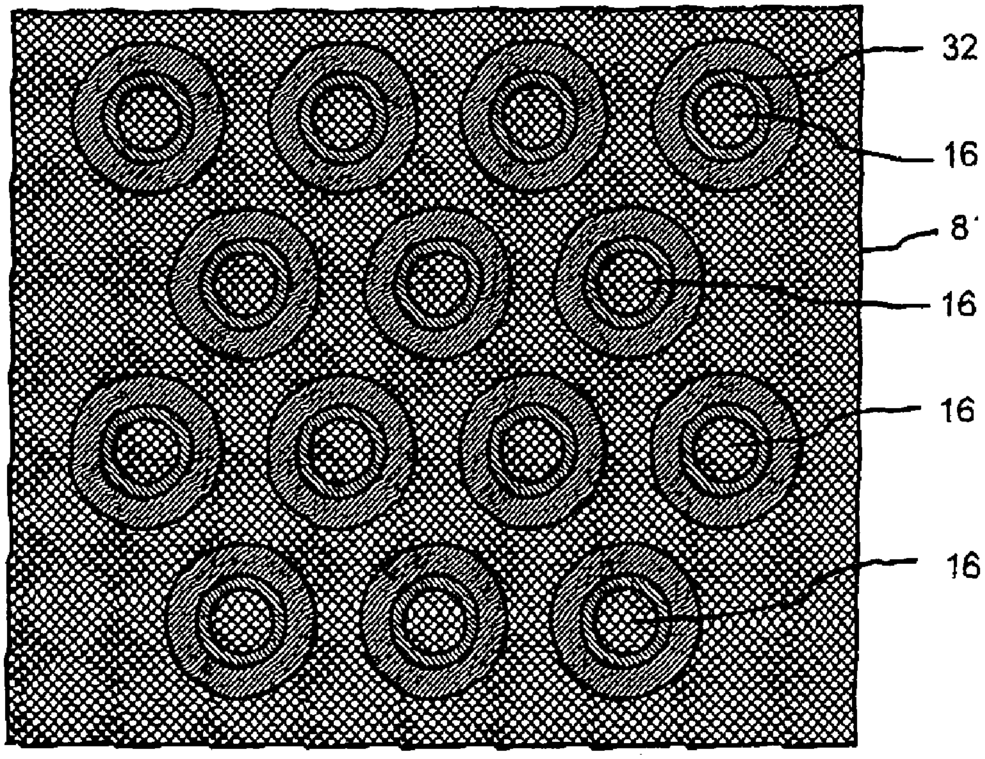
FIG. 6 shows a plan view onto the embodiment from FIG. 5.

Referring now to FIG. 6, a plan view onto the composite element 8' is illustrated. The figure reveals the components 16, with the protective layer 14 cleaned off, each having a ring of solder 32 on the upper surface 10*b*.

Referring once again to FIGS. 4 and 5, the components 16 are machined out without the need for stacking. As a result of the components 16 being punched or drilled out without using a stack, it is possible for the solder pastes to be applied at low cost by structured screen printing in order to form the solder rings 32. The punching-out operation is carried out after the solder paste has been applied.

The solder rings are used, for example, for soldering on windows of optical caps for semiconductor lasers or LED's. Therefore, the solder has been applied in the edge region of the optical component or the window 16.

Figure 7:
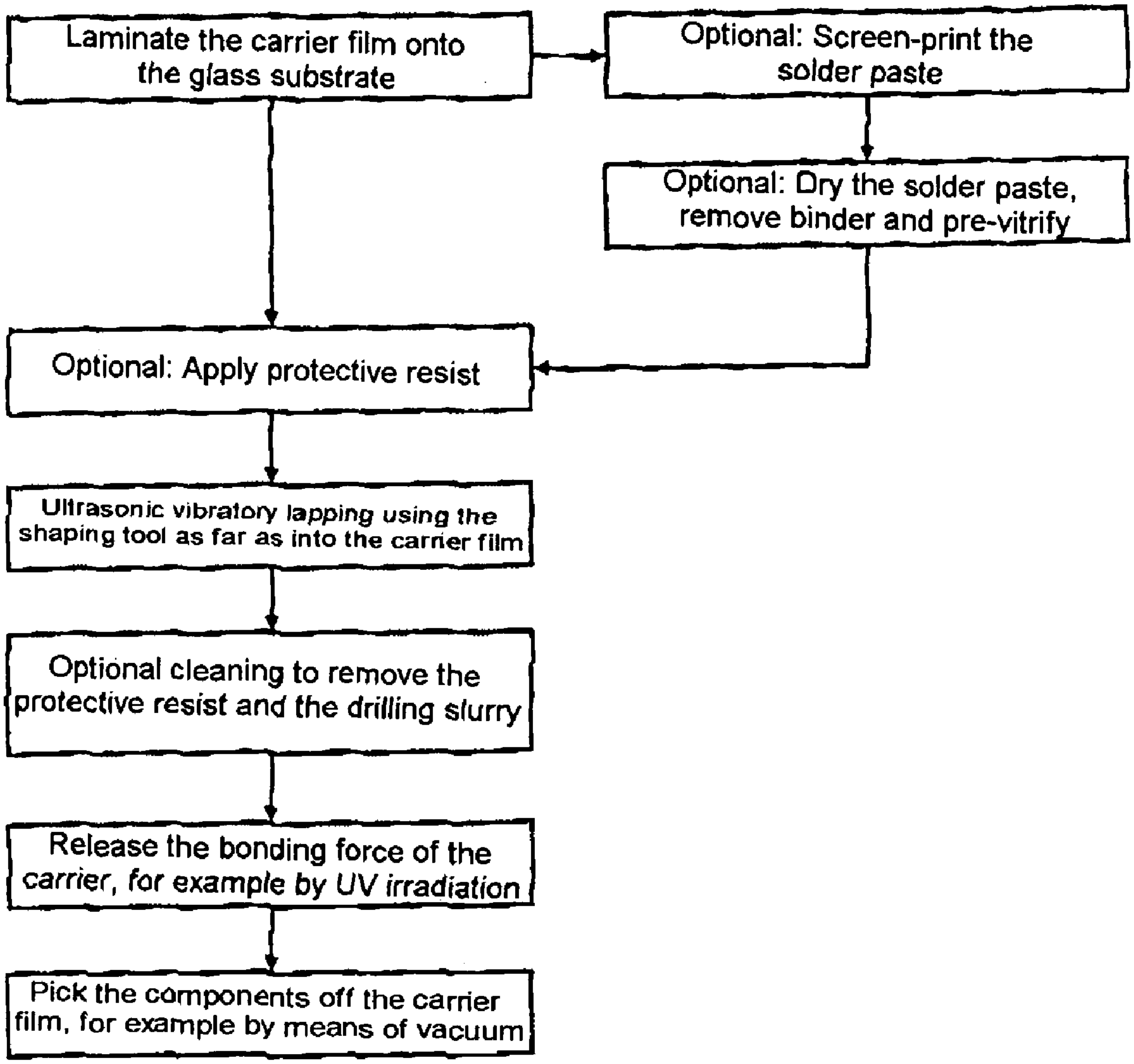
FIG. 7 shows a flow chart of an embodiment of the process according to the invention.

FIG. 7 illustrates a flow diagram for the process according to the invention using ultrasonic vibrator lapping. First of all, the carrier film is laminated onto the glass substrate. Then, the solder paste for producing the solder structures or solder rings 32 is optionally printed on and then dried.

Next, the protective resist 14 is optionally applied. Thereafter, as illustrated in FIG. 4, the components or optical caps 16 are machined out as far as into the carrier film 12 by means of ultrasonic vibratory lapping using a shaping tool that comprises the lapping punches 20.

Next, if present, the protective resist is removed again, e.g. in an ultrasonic washing machine.

Thereafter, the carrier film 12 is irradiated with UV light, with the result that the bonding force on the substrate 10 is released, i.e. weakened, without the carrier film being separated from the substrate 10. Then, the optical caps 16 are picked off the carrier film 12.

Therefore, the invention obviates the complex handling of the small optical windows 16 as far as the step of picking them off the carrier film. This gives rise to significant cost benefits compared to the conventional operation of dispensing in the optical cap.

Figure 8:
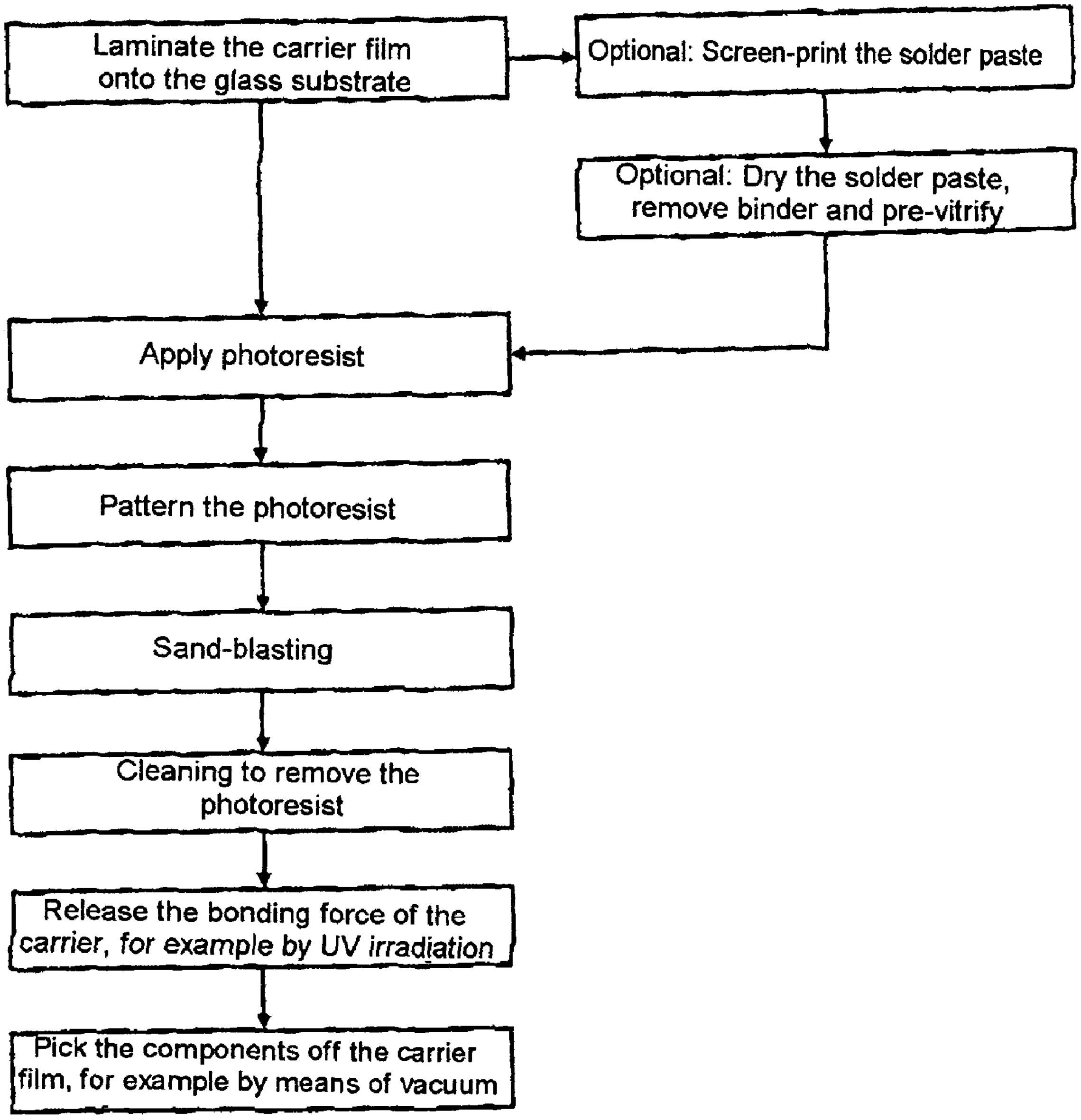
FIG. 8 shows a flow chart of another embodiment of the process according to the invention.

FIG. 8 illustrates a flow diagram for the process according to the invention, similar to FIG. 7. FIG. 8 differs from FIG. 7 by virtue of the fact that instead of ultrasonic vibratory lapping, the optical caps are machined out by means of sand-blasting.

In this case, after the carrier film has been laminated onto the glass substrate and/or the solder paste has dried, a photoresist is applied to the upper surface 10*b* of the substrate 10 and photolithographically patterned. After the patterning, the annular recesses 28 around the optical caps 16 are uncovered. Then, the substrate material is removed from the upper surface 10*b* by means of sand-blasting, at least until the upper surface 12*a* of the carrier film 12 has been reached. Then, the photoresist is removed and the procedure continues as shown in FIG. 7.

It will be clear to the person skilled in the art that the embodiments described above are to be understood as examples and that the invention is not restricted to these embodiments, but rather can be varied in multifarious ways without departing from the scope of the invention.

The invention claimed is:

1. A process for producing a plurality of components, comprising the steps of:

joining a first surface of a substrate to a first surface of a carrier with a bonding force;

applying a protective layer;

machining the plurality of components out of the substrate;

releasing the bonding force between the carrier and the plurality of components with the application of UV light to the bonding force;

detaching the plurality of components from the carrier in order to separate the plurality of components; and removing the protective layer after the machining step and before the detaching step.

2. The process as claimed in claim 1, wherein the plurality of components are separated from one another laterally during the machining step.

3. The process as claimed in claim 1, wherein the substrate comprises glass or a vitreous material.

4. The process as claimed in claim 1, wherein the step of machining comprises removing material from a second surface of the substrate, the second surface being on the opposite side of the substrate from the first surface, the material removed being at least as far as the first surface of the substrate.

5. The process as claimed in claim 4, the step of machining further comprises removing a portion of material from the first surface of the carrier.

6. The process as claimed in claim 1, wherein the step of machining comprises removing portions of the substrate and the carrier in succession until a position between the first surface and a second surface of the carrier is reached, the second surface being on the opposite side of the substrate from the first surface.

7. The process as claimed in claim 1, wherein the step of machining comprises machining a multiplicity of laterally adjacent components out of the substrate in one working step.

8. The process as claimed in claim 1, wherein the step of machining comprises vibratory lapping.

9. The process as claimed in claim 8, wherein the vibratory lapping step comprises using a plurality of hollow lapping punches.

10. The process as claimed in claim 9, wherein the plurality of hollow lapping punches have a cross section in the form of a continuous ring.

11. The process as claimed in claim 1, wherein the step of machining comprises blasting with a blasting material.

12. The process as claimed in claim 1, wherein the substrate has a second surface opposite the first surface, the second surface being a structured surface.

13. The process as claimed in claim 1, wherein the detaching step comprises using a vacuum to separate the plurality of components from the carrier.

14. The process as claimed in claim 1, further comprising applying a solder agent to at least a portion of a second surface of the substrate, the second surface of the substrate being on the opposite side of the substrate from the first surface.

15. The process as claimed in claim 14, wherein the applying step comprises printing the solder agent on the portion of the second surface of the substrate in structured form as a solder-agent layer.

16. The process as claimed in claim 14, further comprising wherein the step of applying the protective layer comprises applying the protective layer to the second surface of the substrate and/or to the solder-agent layer.

17. A process for producing a plurality of components, comprising the steps of:

joining a carrier to a first surface of a substrate with a bonding force;

applying a solder-agent layer to a second surface of the substrate, the second surface being on the opposite side of the substrate from the first surface;

applying a protective layer to the second surface and to the solder-agent layer;

machining the plurality of components out of the substrate by removing material all the way through the protective layer and the substrate and by removing material only part way into the carrier;

removing the protective layer;

releasing the bonding force by the application of UV light; and detaching the plurality of components from the carrier.

* * * * *